(12) United States Patent
Saito et al.

(10) Patent No.: US 8,941,360 B2
(45) Date of Patent: Jan. 27, 2015

(54) BATTERY STATE MONITORING CIRCUIT AND BATTERY DEVICE

(75) Inventors: Hiroshi Saito, Chiba (JP); Kazuaki Sano, Chiba (JP)

(73) Assignee: Seiko Instruments Inc., Chiba (JP)

( * ) Notice: Subject to any disclaimer, the term of this patent is extended or adjusted under 35 U.S.C. 154(b) by 950 days.

(21) Appl. No.: 13/092,602

(22) Filed: Apr. 22, 2011

(65) Prior Publication Data

US 2011/0298463 A1 Dec. 8, 2011

(30) Foreign Application Priority Data

Jun. 4, 2010 (JP) .................................. 2010-129030

(51) Int. Cl.
*H02J 7/00* (2006.01)
*G01N 27/416* (2006.01)
*H01M 10/48* (2006.01)
*G01R 31/36* (2006.01)

(52) U.S. Cl.
CPC ............. *H02J 7/0016* (2013.01); *H02J 7/0026* (2013.01); *H01M 10/482* (2013.01); *G01R 31/3658* (2013.01)
USPC ............................. 320/136; 320/118; 324/429

(58) Field of Classification Search
USPC ................................... 320/136, 118; 324/429
See application file for complete search history.

(56) References Cited

U.S. PATENT DOCUMENTS

| | | | | |
|---|---|---|---|---|
| 6,242,890 B1* | 6/2001 | Sudo et al. | ..................... | 320/128 |
| 7,352,155 B2* | 4/2008 | Li et al. | .......................... | 320/118 |
| 7,498,868 B2* | 3/2009 | Sobue et al. | .................. | 327/538 |
| 8,294,422 B2* | 10/2012 | Tsumura | ....................... | 320/116 |
| 2002/0175655 A1* | 11/2002 | Huykman et al. | ............ | 320/116 |

FOREIGN PATENT DOCUMENTS

JP 08-308115 A 11/1996

* cited by examiner

*Primary Examiner* — Richard V Muralidar
*Assistant Examiner* — David V Henze-Gongola
(74) *Attorney, Agent, or Firm* — Brinks Gilson & Lione

(57) ABSTRACT

Provided are a battery state monitoring circuit and a battery device, in which, even when one secondary battery becomes an overcharged state or an overdischarged state and then a voltage detection circuit operates, power is not consumed in only the one secondary battery. The battery state monitoring circuit includes: a plurality of voltage detection circuits which are provided for a plurality of secondary batteries, respectively, for detecting voltages of the plurality of secondary batteries; and a current bypass circuit provided in each of the plurality of voltage detection circuits, for allowing an operation current of the each of the plurality of voltage detection circuits to flow into a ground terminal. Therefore, when only one secondary battery becomes an overcharged state or an overdischarged state, the battery device operates so that the power of all the secondary batteries is consumed to prevent voltages between the secondary batteries from being unbalanced.

4 Claims, 4 Drawing Sheets

BATTERY STATE MONITORING CIRCUIT AND BATTERY DEVICE

RELATED APPLICATIONS

This application claims priority under 35 U.S.C. §119 to Japanese Patent Application No. 2010-129030 filed on Jun. 4, 2010, the entire content of which is hereby incorporated by reference.

BACKGROUND OF THE INVENTION

1. Field of the Invention

The present invention relates to a battery state monitoring circuit for controlling charge/discharge of a plurality of secondary batteries, and a battery device including the battery state monitoring circuit.

2. Description of the Related Art

FIG. 4 illustrates a circuit diagram of a conventional battery device. In the conventional battery device, two batteries 301 and 302 as secondary batteries are interposed in series between power supply terminals +VB and −VB of a battery state monitoring circuit. A connection point between the two batteries is connected to a VI terminal of the battery state monitoring circuit. A voltage of the battery 301 is divided by a voltage dividing circuit 304. The divided voltage is detected by a voltage detection circuit 305. An output of the voltage detection circuit 305 is input to a control circuit 308. If any one of the batteries is in an overcharged state or an overdischarged state, the control circuit 308 outputs a signal Vs for turning OFF a switch (not shown) provided between the secondary batteries and an external power supply terminal. The control circuit 308 is therefore constituted by a logic circuit alone. Similarly, it is detected by a voltage dividing circuit 306 and a voltage detection circuit 307 whether or not the battery 302 is in an overcharged state or an overdischarged state. A result of the detection is input similarly to the control circuit 308 as a digital signal. Therefore, if any one of the batteries 301 and 302 becomes the overcharged state or the overdischarged state, the control circuit 308 disconnects the batteries and the external power supply, thereby being capable of stopping the progression of overcharge or overdischarge. Two batteries do not have exactly the same charging characteristics and discharging characteristics, and hence it is necessary to detect and control the overcharge and the overdischarge on a battery basis (see, for example, Japanese Patent Application Laid-open No. Hei 08-308115).

The conventional technology, however, has a problem that, if only the secondary battery 301 becomes the overcharged state or the overdischarged state, power of only the secondary battery 301 is consumed by the voltage detection circuit 305 to result in unbalanced voltages between the secondary batteries. If the secondary batteries are charged under the unbalanced voltage state, the charge is stopped when the secondary battery with the highest voltage becomes the overcharged state even if the other batteries have not been sufficiently charged. On the other hand, if the secondary batteries are discharged under the unbalanced voltage state, the discharge is stopped when the secondary battery with the lowest voltage becomes the overdischarged state even if the other batteries still have high voltages. Therefore, there is a problem that the life of the battery device is shortened.

SUMMARY OF THE INVENTION

The present invention has been made in view of the above-mentioned problems, and it is therefore an object thereof to provide a battery state monitoring circuit and a battery device, in which, even when one secondary battery becomes an overcharged state or an overdischarged state and then a voltage detection circuit operates, power is not consumed in only the one secondary battery.

In order to solve the conventional problems, a battery state monitoring circuit and a battery device according to the present invention are configured as follows.

According to the present invention, there is provided a battery state monitoring circuit for detecting and controlling states of a plurality of secondary batteries, including: a plurality of voltage detection circuits which are provided for the plurality of secondary batteries, respectively, for detecting voltages of the plurality of secondary batteries; and a current bypass circuit which is provided in each of the plurality of voltage detection circuits, for allowing an operation current of the each of the plurality of voltage detection circuits to flow into a ground terminal.

Further, a battery device according to the present invention includes the battery state monitoring circuit.

According to the battery device of the present invention, when one secondary battery is detected to be overcharged or overdischarged, power is not consumed in only the one secondary battery and hence voltages between the secondary batteries can be prevented from being unbalanced. Therefore, the life of the battery device can be prevented from being shortened.

DETAILED DESCRIPTION OF THE PREFERRED EMBODIMENTS

Figure 3:
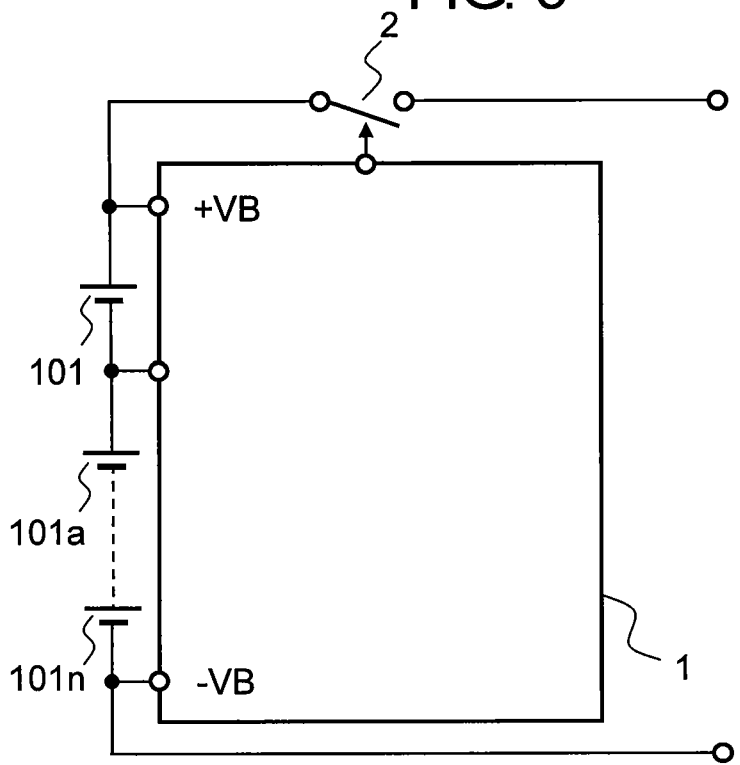
FIG. 3 is a circuit diagram of a battery device including the battery state monitoring circuit according to the present invention.
Figure 4:
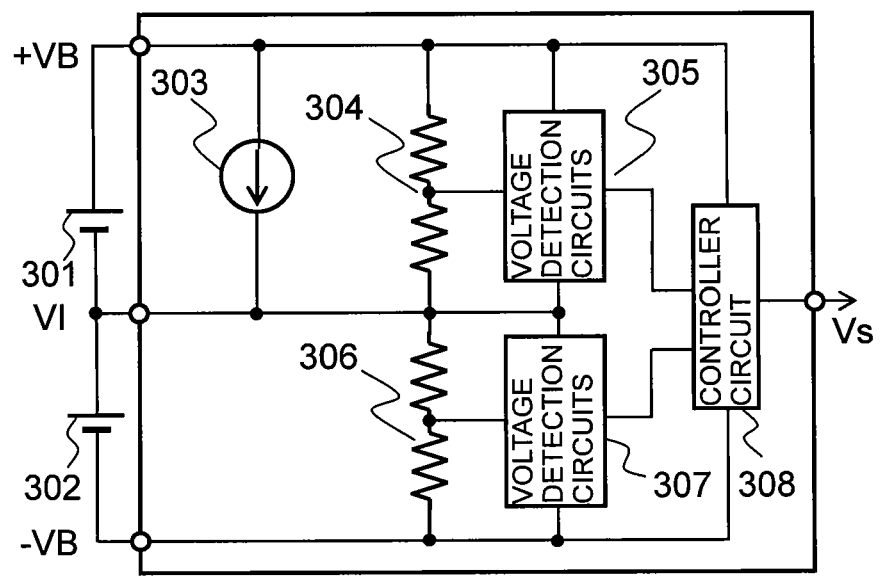
FIG. 4 is a circuit diagram of a conventional battery device including a battery state monitoring circuit.

FIG. 3 is a circuit diagram of a battery device including a battery state monitoring circuit according to the present invention.

The battery device includes a battery state monitoring circuit 1, n series-connected secondary batteries 101 to 101n, and a switch 2 controlled by the battery state monitoring circuit 1.

Referring to the accompanying drawings, the battery device according to each embodiment of the present invention is described below.

[First Embodiment]

Figure 1:
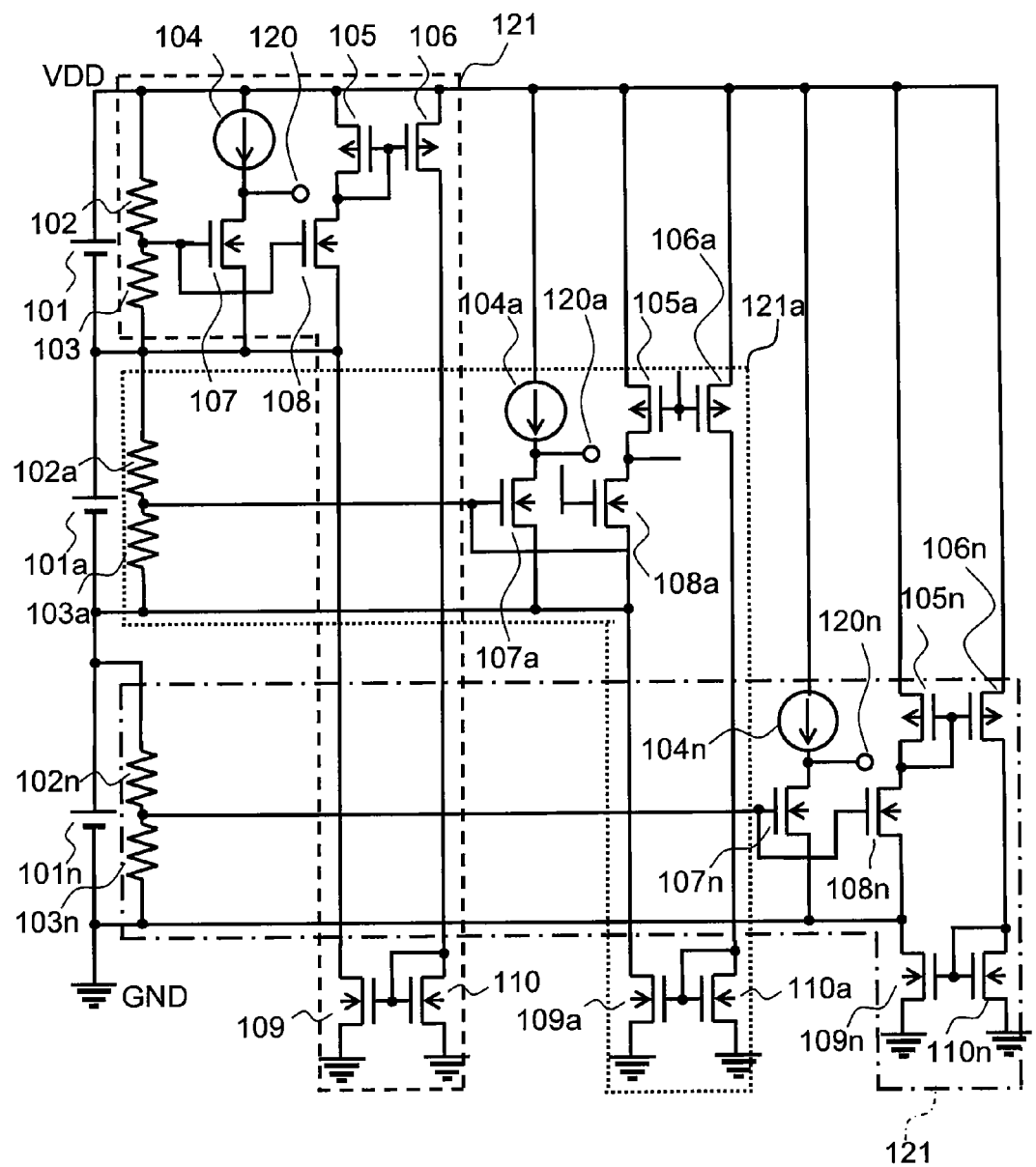
FIG. 1 is a circuit diagram of a battery state monitoring circuit according to a first embodiment of the present invention.

FIG. 1 is a circuit diagram of a battery state monitoring circuit according to a first embodiment of the present invention.

The battery state monitoring circuit according to the first embodiment includes n voltage detection sections 121 to 121n which are individually provided corresponding to the n series-connected secondary batteries 101 to 101n.

The voltage detection section 121 includes a voltage detection circuit and a current bypass circuit. The voltage detection circuit includes a constant current circuit 104 and an NMOS transistor 107. The current bypass circuit includes NMOS transistors 108, 109, and 110 and PMOS transistors 105 and 106.

The other voltage detection sections 121a to 121n have the same components as those of the voltage detection section 121.

Connection in the voltage detection section 121 is described. A resistor 102 has one end connected to a positive terminal of the secondary battery 101 (hereinafter, referred to as VDD terminal) and another end connected to gates of the NMOS transistors 107 and 108. A resistor 103 has one end connected to a negative terminal of the secondary battery 101 and another end connected to the gates of the NMOS transistors 107 and 108. The NMOS transistor 107 has a drain connected to an output terminal 120 and a source connected to the negative terminal of the secondary battery 101. The constant current circuit 104 has one end connected to the VDD terminal and another end connected to the output terminal 120. The NMOS transistor 108 has a drain connected to a gate and a drain of the PMOS transistor 105, and a source connected to the negative terminal of the secondary battery 101. The PMOS transistor 105 has a source connected to the VDD terminal. The PMOS transistor 106 has a gate connected to the gate of the PMOS transistor 105, a drain connected to a drain and a gate of the NMOS transistor 110, and a source connected to the VDD terminal. The NMOS transistor 110 has a source connected to a negative terminal of the secondary battery 101n (hereinafter, referred to as ground terminal). The NMOS transistor 109 has a gate connected to the gate of the NMOS transistor 110, a drain connected to the negative terminal of the secondary battery 101, and a source connected to the ground terminal.

Connection in the voltage detection section 121a is different from the connection in the voltage detection section 121 in that one end of a resistor 102a is connected to a positive terminal of the secondary battery 101a, and the negative terminal of the secondary battery 101 is changed to a negative terminal of the secondary battery 101a. Further, connection in the voltage detection section 121n is different from the connection in the voltage detection section 121 in that one end of a resistor 102n is connected to a positive terminal of the secondary battery 101n, and the negative terminal of the secondary battery 101 is changed to the negative terminal of the secondary battery 101n.

Next, an operation of the battery device according to the first embodiment is described.

If a voltage of the secondary battery 101 increases to reach an overcharged state, in an overcharge detection circuit, which is constituted by the resistors 102 and 103, the constant current circuit 104, and the NMOS transistor 107, a gate voltage of the NMOS transistor 107 is increased, which is obtained by voltage division between the resistor 102 and the resistor 103. Then, the NMOS transistor 107 is turned ON, and a signal of the output terminal 120 is inverted from H to L. Although not illustrated, the signal is input to the control circuit, and the control circuit outputs a signal for turning OFF a switch provided between the secondary batteries and an external terminal. In this manner, overcharge protection is provided. Because the gate of the NMOS transistor 108 is connected to a connection point between the resistors 102 and 103, the NMOS transistor 108 is turned ON at the same time with the NMOS transistor 107. Then, a current flows from the PMOS transistor 105 to the PMOS transistor 106, which together form a current mirror circuit. Similarly, a current flows from the NMOS transistor 110 to the NMOS transistor 109, which together form a current mirror circuit. This way, a path of current flowing to the NMOS transistor 107 is provided so that the current flows from the NMOS transistor 107 to the ground terminal via the NMOS transistor 109. This current path prevents the current flowing through the NMOS transistor 107 from flowing to the negative terminal of the secondary battery 101, which prevents that power of only the secondary battery 101 is consumed. This way, power is consumed in all of the series-connected secondary batteries.

The same operation is performed when a voltage of the secondary battery 101a increases to reach an overcharged state. The NMOS transistor 107a is turned ON to output a signal of L to the output terminal 120a. Then, the NMOS transistor 108a is turned ON to allow a current to flow. The current flows from the PMOS transistor 105a to the PMOS transistor 106a, which together form a current mirror circuit. Similarly, the current flows from the NMOS transistor 110a to the NMOS transistor 109a, which together form a current mirror circuit. This way, a path of current flowing to the NMOS transistor 107a is provided so that the current flows from the NMOS transistor 107a to the ground terminal via the NMOS transistor 109a. This current path prevents the current flowing through the NMOS transistor 107a from flowing to the negative terminal of the secondary battery 101a, which prevents that power of only the secondary battery 101a is consumed. This way, power is consumed in all of the series-connected secondary batteries. Further, the same operation is performed in all of the voltage detection sections 121 to 121n connected to the secondary batteries 101 to 101n.

As described above, even when one secondary battery is detected to be overcharged, power is consumed in all of the series-connected secondary batteries, instead of consuming power only in the one secondary battery. Accordingly, the battery device can be operated while being free from unbalanced voltages between the secondary batteries. Therefore, the battery device can be operated without shortening the life thereof.

[Second Embodiment]

Figure 2:
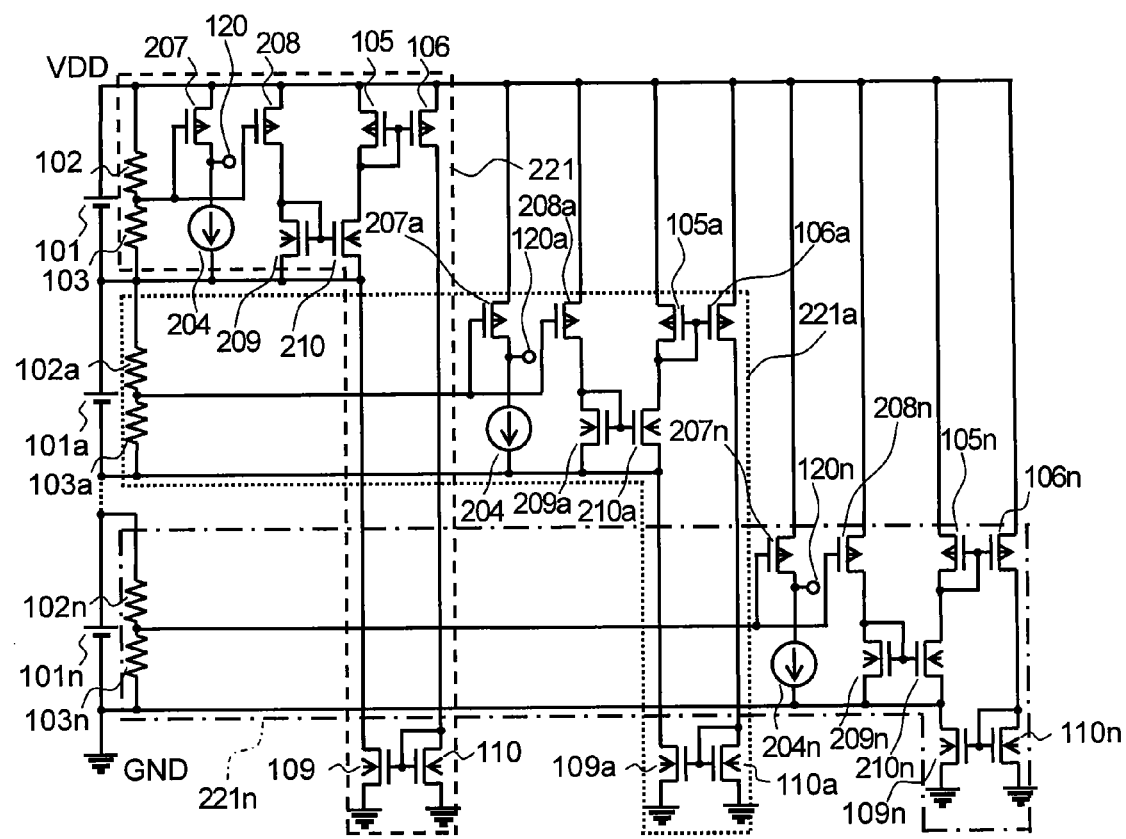
FIG. 2 is a circuit diagram of a battery state monitoring circuit according to a second embodiment of the present invention.

FIG. 2 is a circuit diagram of a battery state monitoring circuit according to a second embodiment of the present invention.

FIG. 2 is different from FIG. 1 in that the NMOS transistors 107, 107a to 107n, 108, and 108a to 108n are changed to PMOS transistors 207, 207a to 207n, 208, and 208a to 208n, and NMOS transistors 209, 209a to 209n, 210, and 210a to 210n are added.

Connection in a voltage detection section 221 is described. The PMOS transistor 207 has a gate connected to the connection point between the resistors 102 and 103 and to a gate of the PMOS transistor 208. The PMOS transistor 207 has a drain connected to the output terminal 120 and a source connected to the VDD terminal. The PMOS transistor 208 has a drain connected to a drain and a gate of the NMOS transistor 209, and a source connected to the VDD terminal. A constant current circuit 204 has one end connected to the output terminal 120 and another end connected to the negative terminal of the secondary battery 101. The NMOS transistor 209 has a source connected to the negative terminal of the secondary battery 101. The NMOS transistor 210 has a gate connected to the gate of the NMOS transistor 209, a source connected to the negative terminal of the secondary battery 101, and a drain connected to the gate and the drain of the PMOS transistor 105. Connection of the other components is the same as that of FIG. 1.

Connection in a voltage detection section 221a is different from the connection in the voltage detection section 221 in that the positive terminal of the secondary battery 101 is changed to a positive terminal of the secondary battery 101a, and the negative terminal of the secondary battery 101 is changed to a negative terminal of the secondary battery 101a. Further, connection in a voltage detection section 221n is different from the connection in the voltage detection section 221 in that the positive terminal of the secondary battery 101 is changed to a positive terminal of the secondary battery 101n, and the negative terminal of the secondary battery 101 is changed to the negative terminal of the secondary battery 101n.

Next, an operation of the battery device according to the second embodiment is described.

If a voltage of the secondary battery 101 decreases to reach an overdischarged state, in an overdischarge detection circuit, which is constituted by the resistors 102 and 103, the constant current circuit 104, and the PMOS transistor 207, a gate voltage of the PMOS transistor 207 is decreased, which is obtained by voltage division between the resistor 102 and the resistor 103. Then, the PMOS transistor 207 is turned ON, and a signal of the output terminal 120 is inverted from L to H. Although not illustrated, the signal is input to the control circuit, and the control circuit outputs a signal for turning OFF a switch provided between the secondary batteries and an external terminal. In this manner, overdischarge protection is provided. Because the gate of the PMOS transistor 208 is connected to the connection point between the resistors 102 and 103, the PMOS transistor 208 is turned ON at the same time with the PMOS transistor 207. Then, a current flows from the NMOS transistor 209 to the NMOS transistor 210, which together form a current mirror circuit. Similarly, a current flows from the PMOS transistor 105 to the PMOS transistor 106, which together form a current mirror circuit. Then, a current flows from the NMOS transistor 110 to the NMOS transistor 109, which together form a current mirror circuit. This way, a path of current flowing to the PMOS transistor 207 is provided so that the current flows from the PMOS transistor 207 to the ground terminal via the NMOS transistor 109. This current path prevents the current flowing through the PMOS transistor 207 from flowing to the negative terminal of the secondary battery 101, which prevents that power of only the secondary battery 101 is consumed. This way, power is consumed in all of the series-connected secondary batteries.

The same operation is performed when a voltage of the secondary battery 101a decreases to reach an overdischarged state. The PMOS transistor 207a is turned ON to output a signal of H to the output terminal 120a. Then, the PMOS transistor 208a is turned ON to allow a current to flow. The current flows from the NMOS transistor 209a to the NMOS transistor 210a, which together form a current mirror circuit. Similarly, the current flows from the PMOS transistor 105a to the PMOS transistor 106a, which together form a current mirror circuit. Then, the current flows from the NMOS transistor 110a to the NMOS transistor 109a, which together form a current mirror circuit. This way, a path of current flowing to the PMOS transistor 207a is provided so that the current flows from the PMOS transistor 207a to the ground terminal via the NMOS transistor 109a. This current path prevents the current flowing through the PMOS transistor 207a from flowing to the negative terminal of the secondary battery 101a, which prevents that power of only the secondary battery 101a is consumed. This way, power is consumed in all of the series-connected secondary batteries. Further, the same operation is performed in all of the voltage detection sections 221 to 221n connected to the secondary batteries 101 to 101n.

As described above, even when one secondary battery is detected to be overdischarged, power is consumed in all of the series-connected secondary batteries, instead of consuming power only in the one secondary battery. Accordingly, the battery device can be operated while being free from unbalanced voltages between the secondary batteries. Therefore, the battery device can be operated without shortening the life thereof.

What is claimed is:

1. A battery state monitoring circuit for detecting and controlling states of a plurality of secondary batteries, the monitoring circuit comprising:
    a plurality of voltage detection circuits for each of the plurality of secondary batteries, respectively, each detecting a voltage of a corresponding one of the plurality of secondary batteries; and
    a current bypass circuit in each of the plurality of voltage detection circuits, for allowing an operation current of each of the plurality of voltage detection circuits to flow into a ground terminal,
    the current bypass circuit comprising:
    a detection transistor for detecting the operation current of the plurality of voltage detection circuits; and
    a plurality of current mirror circuits for allowing the operation current of the plurality of voltage detection circuits to flow into the ground terminal based on a current of the detection transistor.

2. A battery state monitoring circuit according to claim 1, wherein each of the plurality of voltage detection circuits comprises an overcharge detection circuit comprising:
    a voltage dividing circuit connected across a corresponding one of the plurality of secondary batteries;
    a constant current circuit connected to a VDD terminal; and
    a first NMOS transistor including a gate connected to an output terminal of the voltage dividing circuit, a drain connected to the constant current circuit, and a source connected to a negative terminal of the corresponding one of the plurality of secondary batteries, and
    wherein the current bypass circuit further comprises:
    a second NMOS transistor comprising the detection transistor;
    a first current mirror circuit connected to a source of the second NMOS transistor and the VDD terminal; and
    a second current mirror circuit connected to the first current mirror circuit, the ground terminal, and the negative terminal of the corresponding one of the plurality of secondary batteries.

3. A battery state monitoring circuit according to claim 1, wherein each of the plurality of voltage detection circuits comprises an overdischarge detection circuit comprising:
    a voltage dividing circuit connected across a corresponding one of the plurality of secondary batteries;
    a constant current circuit connected to a negative terminal of the corresponding one of the plurality of secondary batteries; and
    a first PMOS transistor including a gate connected to an output terminal of the voltage dividing circuit, a drain connected to the constant current circuit, and a source connected to the VDD terminal, and
    wherein the current bypass circuit further comprises:
    a second PMOS transistor comprising the detection transistor;
    a first current mirror circuit connected to a drain of the second PMOS transistor and the negative terminal of the corresponding one of the plurality of secondary batteries;
    a second current mirror circuit connected to the first current mirror circuit and the VDD terminal; and a third current mirror circuit connected to the second current mirror circuit, the ground terminal, and the negative terminal of the corresponding one of the plurality of secondary batteries.

4. A battery device, comprising:
a plurality of secondary batteries;
a charge/discharge control switch in a charge/discharge path of the plurality of secondary batteries; and
the battery state monitoring circuit according to claim 1, for monitoring voltages of the plurality of secondary batteries and opening/closing the charge/discharge control switch to control charge/discharge of the plurality of secondary batteries.

* * * * *